(12) United States Patent  
Jeong

(10) Patent No.: US 6,370,658 B2  
(45) Date of Patent: Apr. 9, 2002

(54) DEVICE FOR TESTING DIGITAL SIGNAL PROCESSOR IN DIGITAL VIDEO DISC REPRODUCING APPARATUS

(75) Inventor: Jong-Sik Jeong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/025,630

(22) Filed: Feb. 18, 1998

(30) Foreign Application Priority Data

Feb. 20, 1997 (KR) .............................................. 97-5084

(51) Int. Cl.[7] .......................... H02H 3/05; H03K 19/003; H04B 1/74; H04L 1/22; H05K 10/00
(52) U.S. Cl. .............................. 714/25; 714/30; 714/31; 714/45; 714/46; 714/732; 714/735; 714/736
(58) Field of Search .............................. 714/25, 30, 31, 714/45, 46, 732, 735, 736

(56) References Cited

U.S. PATENT DOCUMENTS

| | | | | | |
|---|---|---|---|---|---|
| 5,247,458 A | * | 9/1993 | Cabot | ......................... | 714/736 |
| 5,497,381 A | * | 3/1996 | O'Donoghue et al. | ...... | 714/745 |
| 5,511,108 A | * | 4/1996 | Severt et al. | .................. | 379/21 |
| 5,541,862 A | * | 7/1996 | Bright et al. | ................. | 702/122 |
| 5,642,039 A | * | 6/1997 | Bradley et al. | ........... | 324/76.53 |
| 5,673,272 A | * | 9/1997 | Proskauer et al. | .......... | 714/724 |
| 5,742,569 A | * | 4/1998 | Yamamoto et al. | ............ | 369/32 |
| 5,796,754 A | * | 8/1998 | Son | ........................... | 371/27.1 |
| 5,825,572 A | * | 10/1998 | Morita | ......................... | 360/69 |
| 5,910,957 A | * | 6/1999 | Kim | ........................... | 371/21.1 |
| 5,959,953 A | * | 9/1999 | Alon | ........................ | 369/44.41 |
| 6,016,700 A | * | 1/2000 | Cuffe | ........................... | 73/602 |
| 6,032,247 A | * | 2/2000 | Asghar et al. | ................ | 712/35 |
| 6,058,499 A | * | 5/2000 | Sim | ............................ | 714/755 |
| 6,061,318 A | * | 5/2000 | Hwang | ........................ | 369/58 |
| 6,061,760 A | * | 5/2000 | Huang | ......................... | 711/112 |
| 6,081,783 A | * | 6/2000 | Divine et al. | ............... | 704/500 |

FOREIGN PATENT DOCUMENTS

JP 361208138 A * 9/1986 ..................... 11/22

* cited by examiner

Primary Examiner—Ayaz Sheikh  
Assistant Examiner—Frantz B. Jean  
(74) Attorney, Agent, or Firm—Staas & Halsey LLP

(57) ABSTRACT

A device for testing a digital signal processor in a DVD (Digital Video Disc) reproducing apparatus. The test device includes a computer for generating test data for testing the digital signal processor, and displaying test results on a screen thereof; a track buffer for storing data processed by the digital signal processor and the test results for the digital signal processor; and an interface for transferring the test data output from the computer to the digital signal processor, and reading out the test results from the track buffer to transfer the read test results to the computer. Further, the test device includes a switch for alternately switching the track buffer to the interface and the digital signal processor on a basis of time division, so as to allow the digital signal processor to write the test results in the track buffer and the interface to read the test results stored in the track buffer.

20 Claims, 3 Drawing Sheets

DEVICE FOR TESTING DIGITAL SIGNAL PROCESSOR IN DIGITAL VIDEO DISC REPRODUCING APPARATUS

BACKGROUND OF THE INVENTION

1. Field of the Invention

The present invention relates to a digital video (or versatile) disc (DVD) reproducing apparatus, and in particular, to a device for testing a digital signal processor in a DVD reproducing apparatus, capable of allowing a user to observe a data processing status thereof, step by step.

2. Description of the Related Art

Being developed at the beginning of the 1980s, a CD (Compact Disc) player has made a remarkable development in a recording/reproducing technique as well as in data storage capacity. For instance, a recently developed recordable optical device such as a CD-WO (Write Once) and a CD-MO (Magneto Once) shows that the optical device is no more a read-only device. However, the storage capacity was limited due to the limited disc size and the data recording standard. Incidentally, an optical disc for a mini disc player adopting a data compression technique and a data buffering technique has an increased storage capacity. Above all, a digital video disc (DVD), which is a most recently developed recording medium for a digital moving picture, is suitable for a promising multi-media recording apparatus which can record an MPEG2 (Moving Picture Experts Group 2) digital image of over 2 hours.

FIG. 1 shows a schematic block diagram of a general DVD reproducing apparatus. With reference to FIG. 1, a disc motor 16 rotates a disc 10 at a constant speed, and a head 12 irradiates a laser beam on the disc 10 to read data recorded on the surface thereof. A sled motor 14 actuates an optical pickup 13 on which the head 12 is mounted, so as to move the optical pickup 13 forward and backward with respect to the rotating disc 10. A signal reproducing device 21 amplifies an RF (Radio Frequency) signal output from the optical pickup 13, removes noises therefrom, and performs synchronous detection, so as to reproduce the signal recorded on the disc 10. A servo controller 27 controls rotation of the disc motor 16, and also controls focusing and tracking of the optical pickup 13. A system controller 24 controls an overall operation of the DVD reproducing apparatus. A digital signal processor 23 demodulates a signal output from the signal reproducing device 21 on the basis of 16-8 demodulation, and includes a synchronous detector which has digital PLL (Phase Locked Loop), descrambling, error detection, and track buffer control functions.

Specifically, a 16-8 demodulator (not shown) in the digital signal processor 23 detects a synchronous signal from the received data and demodulates the data to store it into a memory (i.e., track buffer) 22. An error detector (not shown) in the digital signal processor 23 reads the data stored in the track buffer 22 to correct an error thereof and stores again the results into the track buffer 22. Further, the digital signal processor 23 detector detects ID (identification) data representative of the disc position from the data stored in the track buffer 22 and transfers the ID data to the system controller 24, and descrambles the data to store it again into the track buffer 22. The data stored in the track buffer 22 will be transferred to a digital video decoding part at the request for the data. A key input part 25, a user interface, includes a plurality of keys for inputting data or commands. A display 26 displays various operational states of the DVD reproducing apparatus.

A video decoder 32 decodes compressed video data output from the digital signal processor 23 into digital video data. A sub-video decoder 33 decodes sub-video information into still video information in the form of the digital video data. A video blanking information (hereinafter referred to as VBI for short) decoder 34 and a highlight information (HLI) decoder 35 decode data of still video form in such a manner as to conform with a special use. An audio decoder 36 decodes audio data from the digital signal processor 23. A video mixer 29 mixes outputs of the video decoder 32, the sub-video decoder 33, the VBI decoder 34, and the HLI decoder 35. A video output circuit 30 converts the digital video data output from the video mixer 29 into an analog video signal and provides it to a monitor (not shown). An audio output circuit 31 converts the digital audio data output from the audio decoder 36 into an analog audio signal and provides it to a speaker (not shown). Here, the video decoder 32, the sub-video decoder 33, the VBI decoder 34, the HLI decoder 35 and the audio decoder 36 constitute a known video/audio decoder (or MPEG2 decoder) 40. A demultiplexer 28 demultiplexes the data output from the digital signal processor 23 to separately provide the bit stream type information, the video data, audio data, and the sub-video data to the MPEG2 decoder 40, under the control of the system controller 24.

FIG. 2 illustrates a device for testing the digital signal processor 23 shown in FIG. 1 according to the prior art. In the drawing, a computer 70 generates test data, and displays the test results on a screen thereof so that a user of the computer may monitor the test results. A digital signal processor 23 is identical to that shown in FIG. 1. A microcomputer 52 controls an overall operation of the digital signal processor 23. An interface 61 interfaces between the computer 70 and the digital signal processor 23 so as to transfer the test data from the computer 70 to the digital signal processor 23. An SRAM (Static Random Access Memory) 63 stores 8–16 modulated data by 16 sectors (i.e., 32 Kbytes). An SRAM controller 62 generates an address signal and a control signal for reading and transferring the 8–16 modulated data of 16 sectors to the digital signal processor 23. A serial interface 53 transfers the data read from the SRAM 63 to the digital signal processor 23 in the form of serial data. A track buffer 54, which is a DRAM (dynamic RAM), stores the data output from the digital signal processor 23 and the test results for the digital signal processor 23. A measuring device 80 analyzes contents of the track buffer 54.

In accordance with the construction of the conventional test device, to test the digital signal processor 23, data having the same format as that of the data received from the disc 10 should be applied to the test device from the exterior. Thus, the test device should previously have the data value. The input data is 16-8 demodulated at the digital signal processor 23 and then, stored into the track buffer 54. To check whether the input data value is correct or not, an external device is needed to read the contents of the track buffer 54. Moreover, to check an operational status of an error correction circuit, it is needed to perform the error correction in a row direction to check the contents of the track buffer 54, and then perform the error correction in a column direction to check again the contents of the track buffer 54. Further, to examine the data to be transmitted to the MPEG2 decoder 40, an examination of the data which is descrambled is needed. For such a test operation, the test device needs to include an interface means for transferring the 8–16 modulated data from the computer 70 to the digital signal processor 23, and another interface means for examining the contents of the track buffer 54 connected to the digital signal processor 23 for every operational step of the digital signal processor 23. The interface 61 corresponds to the former, and the measuring device 80 corresponds to the latter. Even including the computer 70, the conventional test device should read the contents of the track buffer 54 by using the separate measuring device 80, which is very inefficient and causes a difficulty in analyzing the contents of the track buffer 54.

SUMMARY OF THE INVENTION

It is therefore an object of the present invention to provide a device for effectively testing a digital signal processor and allowing a user to easily observe a data processing status of the digital signal processor, step by step.

Additional objects and advantages of the invention will be set forth in part in the description which follows and, in part, will be obvious from the description, or may be learned by practice of the invention.

To achieve the above and other objects, there is provided a device for testing a digital signal processor in a DVD reproducing apparatus. The test device includes a computer for generating test data for testing the digital signal processor, and displaying test results on a screen thereof; a track buffer for storing data processed by the digital signal processor and the test results for the digital signal processor; and an interface for transferring the test data output from the computer to the digital signal processor, and reading out the test results from the track buffer to transfer the read test results to the computer. Further, the test device includes a switch for switching the track buffer to the interface and the digital signal processor on a basis of time division, so as to allow the digital signal processor to write the test results in the track buffer and the interface to read the test results stored in the track buffer.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

Figure 1:
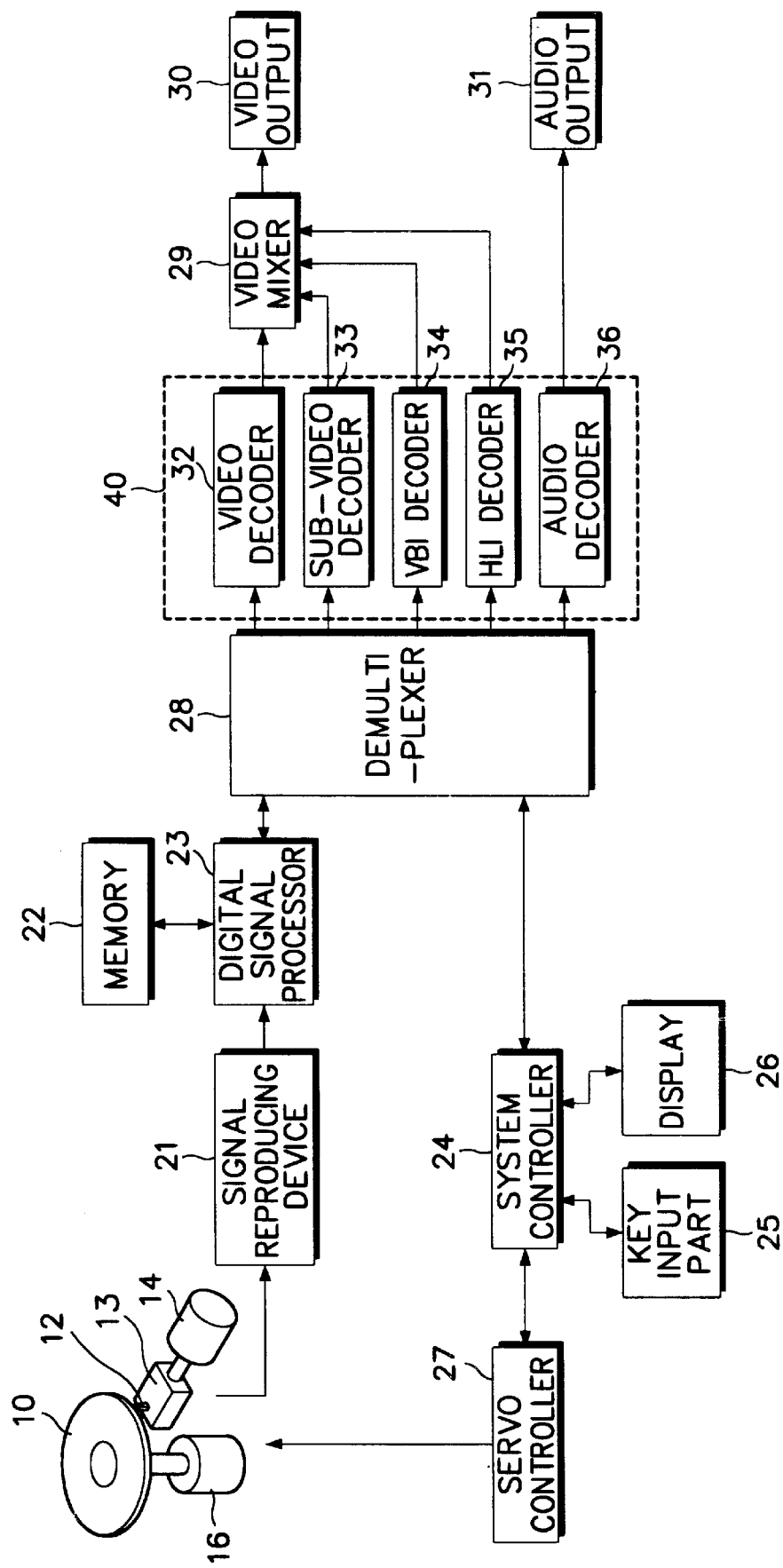
FIG. 1 is a schematic block diagram of a general DVD reproducing apparatus.

A preferred embodiment of the present invention will be described in detail referring to the attached drawings, in which like reference numerals denote the same elements in the drawings, for easy understanding. Though the specific embodiment will be exemplarily defined and described in detail to clarify the subject matter of the present invention, the present invention may be implemented with the knowledge of the present invention by those skilled in the art even without the details. In addition, an unnecessary detailed description of widely known functions and constructions is avoided here.

Figure 2:
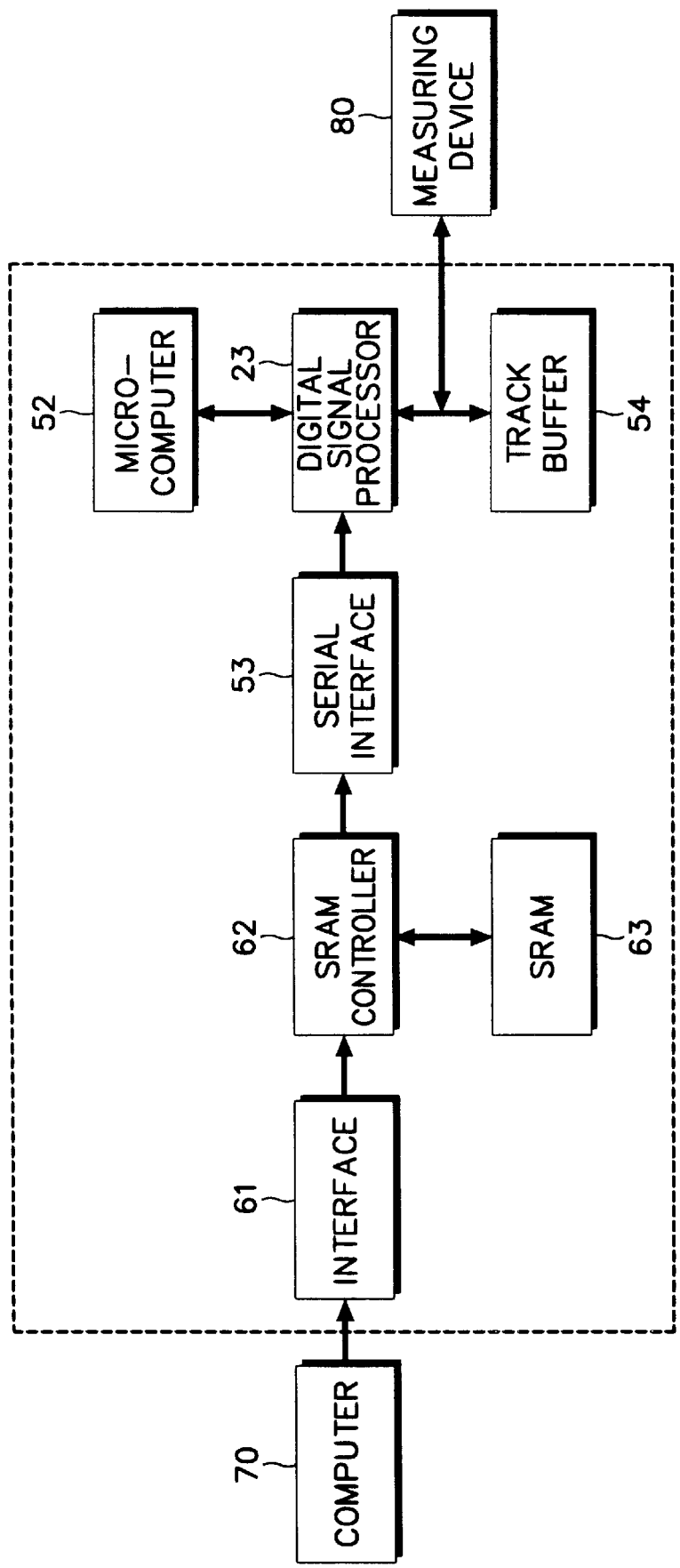
FIG. 2 is a schematic block diagram of a device for testing a digital signal processor in a DVD reproducing apparatus according to the prior art.
Figure 3:
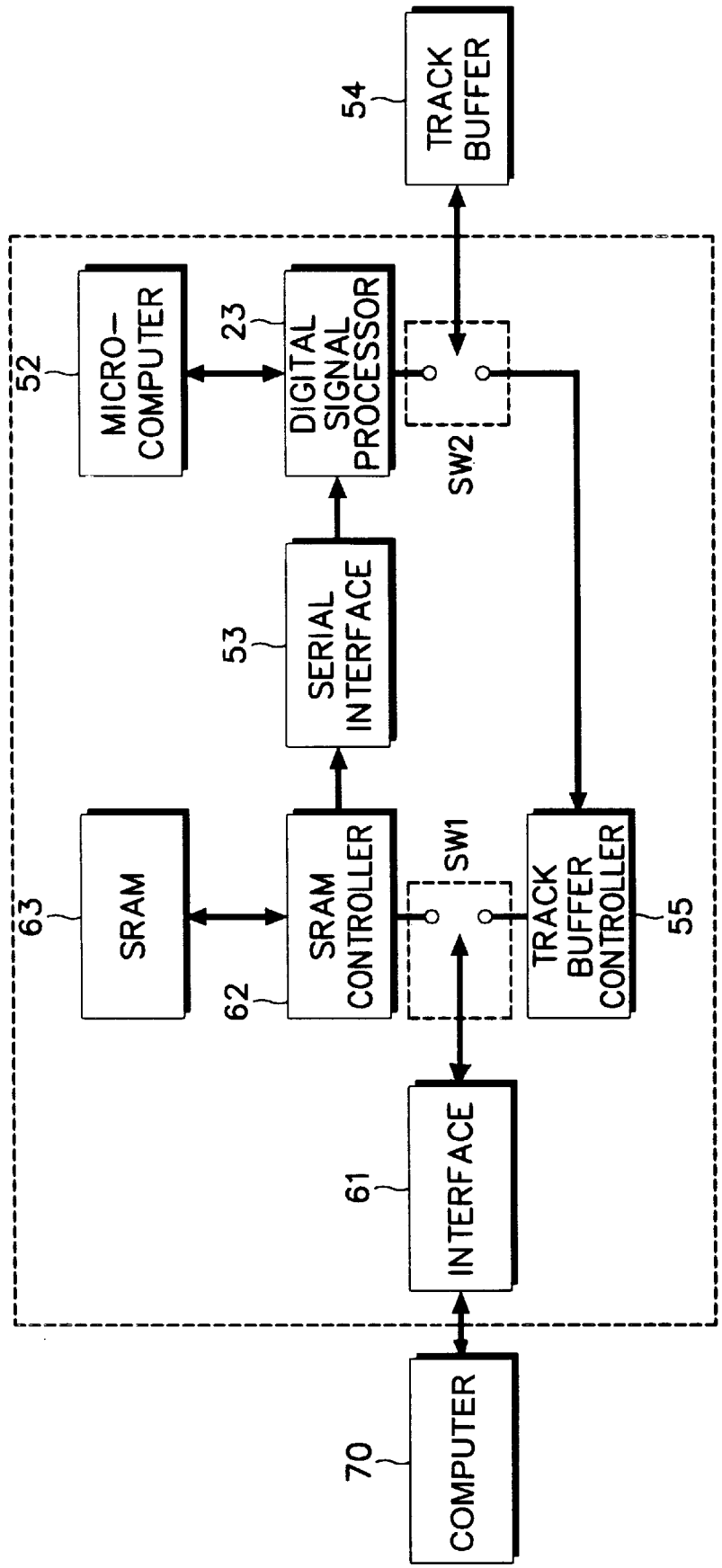
FIG. 3 is a schematic block diagram of a device for testing a digital signal processor in a DVD reproducing apparatus according an embodiment of the present invention.

FIG. 3 illustrates a block diagram of a device for testing a digital signal processor in a DVD reproducing apparatus according to an embodiment of the present invention. As illustrated in the drawing, a computer 70 generates test data for testing a digital signal processor 23, and displays the test results on a screen thereof so as to allow the user to monitor the test results. The digital signal processor 23 has the same construction and function as that shown in FIGS. 1 and 2. A microcomputer 52 controls an overall operation of the digital signal processor 23. An interface 61 transfers the test data output from the computer 70 to the digital signal processor 23, and reads out the test results for the digital signal processor 23 from a track buffer 54 to transfer it to the computer 70. An SRAM 63 stores 8–16 modulated data by 16 sectors (i.e., 32 Kbytes).

An SRAM controller 62 generates an address signal and a control signal for reading out the 8–16 modulated data of 16 sectors from the SRAM 63 to transfer the 8–16 modulated data to the digital signal processor 23. A serial interface 53 transfers, in serial, the data read out from the SRAM 63 to the digital signal processor 23. The track buffer 54, which is a DRAM, stores data output from the digital signal processor 23 and the test results for the digital signal processor 23. A track buffer controller 55 generates address, RAS (Row Address Strobe), and CAS (Column Address Strobe) signals for accessing the track buffer 54. A switch SW1 switches the interface 61 to the SRAM controller 62 and the track buffer controller 55, on the basis of time division. A switch SW2 switches the track buffer 54 to the track buffer controller 55 and the digital signal processor 23, on the basis of time division.

When the computer outputs the test data to the interface 61, the switch SW1 connects the interface 61 with the SRAM controller 62. The test data is then transmitted from the interface 61 to the SRAM controller 62, and then to the serial interface 53, and then to the digital signal processor 23. The digital signal processor 23 processes the test data, and in response, generates the test results. The switch SW2 connects the digital signal processor 23 to the track buffer at this time to transfer the test results to the track buffer 54.

When the track buffer 54 outputs the test results, the switch SW2 is switched to connect the track buffer 54 with the track buffer controller 55 which accesses the track buffer 54. The track buffer controller 55 reads the test results from the track buffer 54. The switch SW1 is switched to connect the track buffer controller 55 with the interface 61. Thus, test data received by the track buffer controller 55 is transmitted through the switch SW1 to the interface 61 which in turn transmits the test results back to the computer 70 for display.

In accordance with the present invention, the computer 70 displays the test results with ASCII data, so that the user may easily monitor the test results. Here, the test results refer to the data indicating whether or not the digital signal processor 23 has correctly performed the demodulation and error correction. Further, the track buffer 54 stores the error-corrected data, so that the computer 70 may check the error correction status by way of the interface 61 and the track buffer controller 55.

As can be appreciated from the foregoing, the device according to the present invention can effectively test the digital signal processor and allow the user to easily observe the data processing status of the digital signal processor, step by step.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed:

1. A device for testing a digital signal processor in a DVD (Digital Video Disc) reproducing apparatus, comprising:
a computer to generate test data for testing the digital signal processor, and to display test results on a screen thereof;
a track buffer to store data processed by the digital signal processor and the test results from the digital signal processor; and
an interface to selectively form a first connection pathway to transfer the test data output from said computer to the digital signal processor, and to selectively form a second connection pathway to read out the test results from said track buffer to transfer said read test results to said computer such that one of the first and second connection pathways is not formed while the other of the first and second connection pathways is formed.

2. A device for testing a digital signal processor in a DVD (Digital Video Disc) reproducing apparatus, comprising:
a computer to generate test data for testing the digital signal processor, and to display test results on a screen thereof;
a track buffer to store data processed by the digital signal processor and the test results from the digital signal processor;
an interface to transfer the test data output from said computer to the digital signal processor, and to read out the test results from said track buffer to transfer said read test results to said computer; and
a switch to alternately switch said track to said interface and the digital signal processor on a basis of time division, so as to allow the digital signal processor to write the test results in said track buffer and said interface to read the test results stored in said track buffer.

3. A test device for testing operation of a digital signal processor in a DVD (Digital Video Disc) reproducing apparatus, comprising:
a computer to generate test data for testing the digital signal processor, and to display test results on a display thereof;
a track buffer to store the test results generated by the digital signal processor in response to the test data; and
an interface to selectively form a first connection pathway to transfer the test data from said computer to the digital signal processor, and to selectively form a second connection pathway to transfer the test results stored said track buffer to said computer for display,
wherein one of the first and second connection pathways is not formed while the other of the first and second pathways is formed.

4. A test device for testing operation of a digital signal processor in a DVD (Digital Video Disc) reproducing apparatus, comprising:
a computer to generate test data for testing the digital signal processor, and to display test results on a display thereof;
a track buffer to store test results generated by the digital signal processor in response to the test data;
an interface to transfer the test data from said computer to the digital signal processor, and to transfer the test results stored in said track buffer to said computer for display;
a track buffer controller to access the test results stored in said track buffer and to transfer the test results to said computer; and
a switch to alternately enable transmission of the test results from the digital signal processor to said track buffer and from said track buffer to said track buffer controller.

5. A test device for testing operation of a digital signal processor in a DVD (Digital Video Disc) reproducing apparatus comprising:
a computer to generate test data for testing the digital signal processor, and to display test results on a display thereof;
a track buffer to store the test results generated by the digital signal processor in response to the test data;
an interface to transfer the test data from said computer to the digital signal processor, and to transfer the test results stored in said track buffer to said computer for display;
a track buffer controller to access the test results stored in said track buffer; and
a switch to alternately enable transmission of the test data from said interface to the digital signal processor and the test results from said track buffer controller to said interface.

6. A test device for testing operation of a digital signal processor in a DVD (Digital Video Disc) reproducing apparatus comprising:
a computer to generate test date for testing the digital signal processor, and to display test results on a display thereof;
a track buffer to store the test results generated by the digital signal processor in response to the test data;
an interface to transfer the test data from said computer to the digital signal processor, and to transfer the test results stored in said track buffer to said computer for display;
a track buffer controller to access the test results stored in said track buffer;
a first switch to alternately enable transmission of the test data from said interface to the digital signal processor and the test results from said track buffer controller to said interface; and
a second switch to alternately enable transmission of the test results from the digital signal processor to said track buffer and from said track buffer to said track buffer controller.

7. The test device as claimed in claim 6, wherein said first and second switches switch based upon time division.

8. The test device as claimed in claim 7, wherein said first switch enables transmission of the test data from said interface to said SRAM controller and said second switch enables transmission of the test results from the digital signal processor to said track buffer, during a first time period of generating the test results from the test data and storing the test results in said track buffer, and said second switch enables transmission of the test results stored in said track buffer from said track buffer to said track buffer controller and said first switch enables transmission of the test results from said track buffer controller to said interface during a second time period of displaying the test results which have been stored in said track buffer.

9. The test device as claimed in claim 6, further comprising:
an SRAM (static random access memory) to store the test data;
an SRAM controller to receive the test data from said interface via said first switch and to generate an address signal and a control signal to read out the test data from said SRAM; and a serial interface to transfer the test data read out by said SRAM controller to the digital signal processor in serial;

wherein said first switch alternately enables transmission of the test data from said interface to said SRAM controller and the test results from said track buffer controller to said interface.

10. The test device as claimed in claim 6, wherein said first switch enables transmission of the test data from said interface to the digital signal processor and said second switch enables transmission of the test results from the digital signal processor to said track buffer, during a first time period of generating the test results from the test data and storing the test results in said track buffer, and said second switch enables transmission of the test results stored in said track buffer from said track buffer to said track buffer controller and said first switch enables transmission of the test results from said track buffer controller to said interface during a second time period of displaying the test results which have been stored in said track buffer.

11. A method of testing a digital signal processor (DSP) in a digital video disc (DVD) reproducing apparatus, comprising:

generating test data;

selectively forming a first communication pathway and transferring the test data to the DSP using a common interface;

processing the test data in the DSP and producing test results; and selectively forming a second communication pathway and transferring the test results using the common interface, wherein one of the first and second connection pathways is not formed while the other of the first and second connection pathways is formed.

12. The method of testing the DSP as claimed in claim 11, further comprising storing the test results in a memory, and wherein said transferring the test results using the common interface further comprises reading the test results from the memory, and transferring the read test results.

13. The method of testing the DSP as claimed in claim 12, wherein said generating the test data comprises using a common computer to generate the test data, and wherein said transferring the test results using the common interface comprises transferring the read test results to the common computer.

14. The method of testing the DSP as claimed in claim 13, further comprising displaying the transferred test results.

15. The method of testing the DSP as claimed in claim 11, wherein said generating the test data comprises using a common computer to generate the test data, and wherein said transferring the test results using the common interface comprises transferring the test results to the common computer.

16. The method of testing the DSP as claimed in claim 11, further comprising displaying the transferred test results.

17. The method of testing the DSP as claimed in claim 11, wherein said forming the first communication pathway comprises selecting the first communication pathway on a basis of time division.

18. The method of testing the DSP as claimed in claim 17, wherein said forming the first communication pathway further comprises activating a switch to select the first communication pathway on the basis of time division.

19. The method of testing the DSP as claimed in claim 18, wherein said forming the second communication pathway comprises activating another switch to select the second communication pathway on the basis of time division.

20. The method of testing the DSP as claimed in claim 11, wherein said forming the second communication pathway comprises selecting the first communication pathway on a basis of time division.

* * * * *